(12) United States Patent
Hamada

(10) Patent No.: US 8,541,149 B2
(45) Date of Patent: Sep. 24, 2013

(54) METHOD OF ADHERING LITHOGRAPHIC PELLICLE AND ADHERING APPARATUS THEREFOR

(75) Inventor: Yuichi Hamada, Gunma (JP)

(73) Assignee: Shin-Etsu Chemical Co. Ltd., Tokyo (JP)

( * ) Notice: Subject to any disclaimer, the term of this patent is extended or adjusted under 35 U.S.C. 154(b) by 161 days.

(21) Appl. No.: 13/297,944

(22) Filed: Nov. 16, 2011

(65) Prior Publication Data
US 2012/0129082 A1    May 24, 2012

(30) Foreign Application Priority Data

Nov. 19, 2010 (JP) ................................. 2010-259363

(51) Int. Cl.
*G03F 1/62* (2012.01)

(52) U.S. Cl.
USPC ............................................................ 430/5

(58) Field of Classification Search
USPC ................................ 430/5; 428/14; 156/580
See application file for complete search history.

(56) References Cited

U.S. PATENT DOCUMENTS

| 4,657,805 A | 4/1987 | Fukumitsu et al. |
| 4,861,402 A | 8/1989 | Gordon |
| 4,878,973 A | 11/1989 | Ohtake et al. |
| 2009/0073415 A1 * | 3/2009 | Lee et al. ......................... 355/75 |

FOREIGN PATENT DOCUMENTS

| JP | 58-219023 A | 12/1983 |
| JP | 60-083032 | 5/1985 |
| JP | 63-27707 B2 | 6/1988 |
| JP | 07-168345 A | 7/1995 |

* cited by examiner

Primary Examiner — Stephen Rosasco
(74) Attorney, Agent, or Firm — Seed IP Law Group PLLC

(57) ABSTRACT

A method of adhering a lithographic pellicle includes steps of pressing the pellicle frame 6 toward the exposure stencil 5 by a pressure plate 2 via a bag 3 containing a low viscosity liquid being mounted on the surface of the pressure plate 2 facing the pellicle frame 6 so as to be along sides of the pellicle frame 6 and face the pellicle frame 6, the compressively deformable member being easily deformable when a pressure is applied thereonto.

According to the thus constituted method of adhering a pellicle, it is possible to uniformize a pressure applied onto an exposure stencil 5 such as a photomask, a reticle or the like via a pellicle frame 6 when a pellicle is adhered onto the exposure stencil 5.

20 Claims, 3 Drawing Sheets

METHOD OF ADHERING LITHOGRAPHIC PELLICLE AND ADHERING APPARATUS THEREFOR

BACKGROUND OF THE INVENTION

The present invention relates to a method of adhering a pellicle which can uniformize a pressure applied onto an exposure stencil such as a photomask, reticle or the like via a pellicle frame when a pellicle is to be adhered onto the exposure stencil and effectively prevent the exposure stencil from being deformed when the pellicle is adhered onto the exposure stencil and an adhering apparatus for a pellicle which can uniformize a pressure applied onto an exposure stencil such as a photomask, a reticle or the like via a pellicle frame when a pellicle is adhered onto the exposure stencil and effectively prevent the exposure stencil from being deformed when the pellicle is adhered onto the exposure stencil.

DESCRIPTION OF THE PRIOR ART

In the case of manufacturing a semiconductor device such as a large-scale integrated circuit (LSI), a very-large-scale integrated circuit or the like, or a liquid crystal display panel (hereinafter collectively referred to as "a semiconductor device" in this specification), a semiconductor wafer or a mother substrate for a liquid crystal display panel is irradiated with exposure light via an exposure stencil such as a photomask, a reticle or the like, whereby a pattern of the photomask is transferred onto the surface of the semiconductor wafer or the surface of the mother substrate for a liquid crystal display panel or a pattern of the reticle is transferred onto the surface of the semiconductor wafer or the surface of the mother substrate for a liquid crystal display panel so that the pattern of the semiconductor device is formed.

Therefore, when the semiconductor wafer or the liquid crystal display panel mother substrate is irradiated with exposure light via the exposure stencil such as a photomask, a reticle or the like, any foreign materials such as dust particles that stick to the exposure stencil reflect or absorb the exposure light, so that not only does the pattern transferred onto the surface of the semiconductor wafer or the surface of the liquid crystal display panel mother substrate become deformed and the edge portion of the pattern become blurred but the underlying surface is also blackened by soiling, whereby the size, quality, appearance and the like of the semiconductor wafer or the liquid crystal display panel mother substrate are degraded. As a result, the pattern of the photomask, or that of the reticle or the like cannot be transferred onto the surface of the semiconductor wafer or the surface of the liquid crystal display panel mother substrate in the desired manner and the performance of the semiconductor wafer or the liquid crystal display panel mother substrate is lowered, whereby the yield ratio of the semiconductor device is inevitably reduced.

In order to prevent these problems, the operation of exposing the semiconductor wafer or the liquid crystal display panel mother substrate is generally conducted in a clean room. However, even in such a case, since it is extremely difficult to completely prevent foreign materials from attaching to the surface of the exposure stencil such as a photomask, a reticle or the like, the operation of exposing the semiconductor wafer or the liquid crystal display panel mother substrate is usually conducted with a dust proof cover, called a pellicle, having a high transmittance with respect to the exposure light.

In general, a pellicle is manufactured by adhering a pellicle membrane made of a cellulose based resin like nitrocellulose or cellulose acetate, fluoride resin or the like having a high transmittance with respect to exposure light such as G-line UV, I-line UV, light having a wavelength of 248 nm, light having a wavelength of 193 nm, light having a wavelength of 157 nm or the like, to one surface of a pellicle frame made of aluminum alloy such as A7075, A6061, A5052 subjected to black alumite processing or the like, stainless steel, polyethylene or the like by applying a good solvent for the material of the pellicle membrane onto the one surface of the pellicle frame and adhering the air-dried pellicle membrane onto the one surface of the pellicle frame, or adhering the pellicle membrane onto the one surface of the pellicle frame using an adhesive agent such as acrylic resin, epoxy resin, fluorine resin or the like, forming an agglutinant layer composed of polybutene resin, polyvinyl acetate resin, acrylic resin, silicone resin or the like and adapted for adhering the semiconductor wafer or the liquid crystal display panel mother substrate to the pellicle frame on the other surface of the pellicle frame, and providing a release layer or a separator for protecting the agglutinant layer on the agglutinant layer (See Japanese Patent Application Laid Open No. 58-219023, U.S. Pat. No. 4,861,402, Japanese Patent Publication No. 63-27707 and Japanese Patent Application Laid Open No. 7-168345, for example).

The thus constituted pellicle is adhered to the exposure stencil such as a photomask or reticle so as to surround a pattern region formed on the surface of the exposure stencil, whereby the pattern region formed on the surface of the exposure stencil and the region outside of the pellicle are isolated from each other so that foreign materials such as dust particles present outside of the pellicle are prevented from adhering to the pattern region formed on the surface of the exposure stencil such as the photomask, reticle or the like.

In the case of mounting the thus constituted pellicle on the surface of the exposure stencil such as the photomask, the reticle or the like and exposing the semiconductor wafer or the liquid crystal display panel mother substrate via the exposure stencil, since foreign materials such as dust particles attach to the surface of the pellicle and do not directly attach to the surface of the exposure stencil, it is possible to avoid the effect of foreign materials such as dust particles by projecting exposure light in such a manner that the light is focused on the pattern formed on the exposure stencil such as the photomask, the reticle or the like.

Recently, LSI design rules have grown finer down to subquarter micron order, which requires the use of an exposure light source having a shorter wavelength and even an ArF excimer laser having a short wavelength of 193 nm cannot satisfy this requirement. Thus, nowadays, it may sometimes be necessary to divide a printed pattern into a plurality of sub-pattern regions and carry out an exposure operation separately for each sub-pattern region.

In the case of dividing the printed pattern into a plurality of sub-pattern regions and exposing the sub-pattern regions one by one, it is strictly required to superpose the light path of the exposure light and each of the sub-pattern regions with an extremely high accuracy. Therefore, even only a slight deformation of the exposure stencil such as the photomask, the reticle or the like causes shifting of the pattern to be transferred onto the semiconductor wafer or the liquid crystal display panel mother substrate. Thus, even if the exposure stencil such as the photomask, the reticle or the like can be fabricated with a high flatness, in the case where the exposure stencil is distorted during the step of adhering a pellicle onto the exposure stencil, failure inevitably occurs in the lithography step.

In order to prevent the exposure stencil such as the photomask, the reticle or the like from being distorted in the step of adhering a pellicle to the exposure stencil, efforts have been made toward the development of an agglutinant agent for adhering the pellicle onto the exposure stencil, development of a pellicle having a high flatness, and reduction of the load used for adhering the pellicle onto the exposure stencil. However, there has not yet been proposed a sufficiently effective solution enabling a pressure applied onto the exposure stencil from a pellicle frame to be uniformized when a pellicle is adhered onto the exposure stencil.

SUMMARY OF THE INVENTION

It is therefore an object of the present invention to provide a method of adhering a lithographic pellicle which can uniformize a pressure applied onto an exposure stencil such as a photomask, a reticle or the like via a pellicle frame when a pellicle is adhered onto the exposure stencil and effectively prevent the exposure stencil from being deformed when the pellicle is adhered onto the exposure stencil.

It is another object of the present invention to provide an adhering apparatus for a lithographic pellicle which can uniformize a pressure applied onto an exposure stencil such as a photomask, a reticle or the like via a pellicle frame when a pellicle is adhered onto the exposure stencil and effectively prevent the exposure stencil from being deformed when the pellicle is adhered onto the exposure stencil.

The above and other objects of the present invention can be accomplished by a method of adhering a pellicle for lithography comprising a step of adhering a frame-like shaped pellicle frame onto an exposure stencil, the method further comprising a step of pressing the pellicle frame toward the exposure stencil by a pressure plate via a compressively deformable member mounted on the surface of the pressure plate in such a manner that it can meet the sides of the pellicle frame, the frame-like shaped compressively deformable member being easily deformable when a pressure is applied thereto.

When the flatness of the pellicle frame is low so that the surface of the pellicle frame facing the pressure plate is formed with convex surface regions and concave surface regions, direct pressing of the pellicle frame with the pressure plate would apply excessively high pressure onto the convex surface regions of the pellicle frame and low pressure onto the concave surface region to make the pressure applied onto the pellicle frame non-uniform, but according to the present invention, the pellicle frame of the pellicle is pressed by the pressure plate toward the exposure stencil such as a photomask, a reticle or the like via the frame-like shaped compressively deformable member that is easily deformable when a pressure is applied, so that in such a case, the regions of the frame-like shaped compressively deformable member adjacent to the convex surface regions of the pellicle frame onto which a high pressure is applied are greatly deformed to reduce or absorb the pressure applied onto the pellicle frame, while the deformation of the regions of the frame-like shaped compressively deformable member adjacent to the concave surface regions of the pellicle frame onto which a low pressure is applied is small, so that the pressure applied onto the pellicle frame increases. Therefore, even in the case where the flatness of the pellicle frame is low, the pressure transferred from the pellicle frame to the exposure stencil can be uniformized to effectively prevent the exposure stencil from being deformed by the application of a non-uniform pressure from the pellicle frame.

In this specification, the term "flatness" of the exposure stencil such as the photomask, the reticle or the like or the term "flatness" of the pellicle frame is defined as the distance between the uppermost part of the exposure stencil or the pellicle frame which is placed horizontally and the lowermost part of the exposure stencil or the pellicle frame with respect to an averaged hypothetical surface of the exposure stencil placed horizontally or the pellicle frame placed horizontally, and "a high flatness" is defined to mean that the distance between the uppermost part of the exposure stencil or the pellicle frame and the lowermost part thereof is small and "a low flatness" is defined to mean that the distance between the uppermost part of the exposure stencil or the pellicle frame and the lowermost part thereof is large.

The above and other objects of the present invention can be also accomplished by an adhering apparatus for a pellicle for lithography comprising a pressure plate for pressing a frame-like shaped pellicle frame of a pellicle toward an exposure stencil, wherein a frame-like shaped compressively deformable member easily deformable when being pressed is mounted on the surface of the pressure plate facing the pellicle frame so as to align with the sides of the pellicle frame.

According to the present invention, the adhering apparatus for a lithographic pellicle is provided with the pressure plate for pressing the pellicle frame of the pellicle toward the exposure stencil such as the photomask, the reticle or the like and the surface of the pressure plate facing the pellicle frame is formed with the frame-like shaped compressively deformable member that is easily deformable when a pressure is applied thereto. As noted above, when the flatness of the pellicle frame is low and the surface of the pellicle frame facing the pressure plate includes convex surface regions and concave surface regions, direct pressing of the pellicle frame toward the exposure stencil with the pressure plate would make the concave surface regions of the pellicle frame high and the pressure applied onto the convex surface regions of the pellicle frame low, so that the pressure applied onto the pellicle frame would be non-uniform. However, according to the adhering apparatus of the present invention, the regions of the frame-like shaped compressively deformable member adjacent to the convex surface regions of the pellicle frame onto which a high pressure is applied are greatly deformed to reduce the pressure applied onto the pellicle frame, while the regions of the frame-like shaped compressively deformable member adjacent to the concave surface regions of the pellicle frame onto which a low pressure is applied are greatly deformed to reduce the pressure applied onto the pellicle frame, so that the pressure applied onto the pellicle frame is increased. Therefore, even in the case where the flatness of the pellicle frame is low, the pressure transferred from the pellicle frame to the exposure stencil can be uniformized to effectively prevent the exposure stencil from being deformed by the application of a non-uniform pressure from the pellicle frame.

In a preferred aspect of the present invention, the compressively deformable member having a frame-like shape is constituted so that the amount of deformation thereof depends upon the magnitude of pressure applied thereto.

In a further preferred aspect of the present invention, the compressively deformable member having a frame-like shape is constituted so that the magnitude of deformation thereof is substantially proportional to the magnitude of pressure applied thereto.

In another preferred aspect of the present invention, the compressively deformable member having a frame-like shape is constituted by a bag containing a low viscosity liquid.

According to this preferred aspect of the present invention, when the pellicle frame is to be pressed toward the exposure stencil such as the photomask, the reticle or the like, if the flatness of the pellicle frame is low, so that directly pressing the pellicle frame toward the exposure stencil with the pressure plate would make the pressure applied onto the convex surface regions of the pellicle frame high and the pressure applied onto the concave surface regions of the pellicle frame low, i.e., so that non-uniform pressure would be applied onto the pellicle frame, in such a case, the low viscosity liquid contained in the bag adjacent to the convex surface regions of the pellicle frame is pushed away, whereby the bag is greatly deformed, while in the regions of the bag adjacent to the concave surface regions of the pellicle frame onto which a low pressure is applied, the low viscosity liquid contained in the bag adjacent to convex surface regions of the pellicle frame onto which a high pressure is applied flows into the regions of the bag adjacent to the concave surface regions of the pellicle frame, whereby the deformation of the bag is small. Therefore, even if the flatness of the pellicle frame is low, the pressure transferred from the pellicle frame to the exposure stencil can be uniformized to effectively prevent the exposure stencil from being deformed by application of a non-uniform pressure from the pellicle frame.

In another preferred aspect of the present invention, the compressively deformable member having a frame-like shaped is formed of a resin having a low elasticity.

According to this preferred aspect of the present invention, when the pellicle frame is to be pressed toward the exposure stencil such as the photomask, the reticle or the like, if the flatness of the pellicle frame is low, so that directly pressing the pellicle frame toward the exposure stencil with the pressure plate would make the pressure applied onto the convex surface regions of the pellicle frame high and the pressure applied onto the concave surface regions of the pellicle frame low, i.e., so that non-uniform pressure would be applied onto the pellicle frame, in such a case the resin having a low elasticity is greatly deformed to absorb excess pressure in the regions of the resin having a low elasticity adjacent to the convex surface regions of the pellicle frame onto which a high pressure is applied, while in the regions of the resin having a low elasticity adjacent to the concave surface regions of the pellicle frame onto which a low pressure is applied, the deformation of the resin having a low elasticity is small. Therefore, even if the flatness of the pellicle frame is low, the pressure transferred from the pellicle frame to the exposure stencil can be uniformized to effectively prevent the exposure stencil from being deformed by application of a non-uniform pressure from the pellicle frame.

In another preferred aspect of the present invention, the frame-like shaped compressively deformable member is constituted by a plurality of unit compressively deformable members aligned to meet the sides of the pellicle frame.

In a further preferred aspect of the present invention, the center-to-center distance of the neighboring unit compressively deformable members measured along the pellicle frame is determined to be equal to or shorter than five mm.

In a further preferred aspect of the present invention, the unit compressively deformable member is constituted as a spring member and the compressively deformable member having frame-like shape is constituted by a plurality of spring members that are provided to be aligned to meet the sides of the pellicle frame and have the same spring coefficient.

According to this preferred aspect of the present invention, when the pellicle frame is to be pressed toward the exposure stencil such as the photomask, the reticle or the like, if the flatness of the pellicle frame is low so that directly pressing the pellicle frame toward the exposure stencil with the pressure plate would make the pressure applied onto the convex surface regions of the pellicle frame high and the pressure applied onto the concave surface regions of the pellicle frame low, i.e., so that non-uniform pressure would be applied onto the pellicle frame, in such a case the spring members adjacent to the convex surface regions of the pellicle frame onto which a high pressure is applied are greatly compressed, while the spring members adjacent to the concave surface regions of the pellicle frame onto which a low pressure is applied are only slightly compressed. Therefore, even if the flatness of the pellicle frame is low, the pressure transferred from the pellicle frame to the exposure stencil can be uniformized to effectively prevent the exposure stencil from being deformed by application of a non-uniform pressure from the pellicle frame.

In the present invention, it is preferable for the load used to press the pressure plate to be equal to or smaller than 10 kg.

Further, in the present invention, it is preferable for the velocity of the pressure plate when the compressively deformable member having a frame-like shape is in contact with the pellicle frame to be low and it is particularly preferable for the velocity of the pressure plate when the compressively deformable member having a frame-like shape is in contact with the pellicle frame to be equal to or lower than 1 mm/sec.

Moreover, in the present invention, it is preferable for the flatness of the pellicle frame to be equal to or lower than 30 μm and it is more preferable for the flatness of the pellicle frame to be equal to or lower than 10 μm.

In the present invention, in order to prevent the exposure stencil such as the photomask, the reticle or the like from being distorted due to a non-uniform pressure applied from the pellicle frame, it is preferable for the surface of an agglutinant agent resin layer to be considerably flattened and it is preferable for agglutinant agent resin to be soft.

Pellicle frames generally are divided broadly into pellicle frames having a thickness equal to or thinner than 4 mm and pellicle frames having a thickness thicker than 4 mm. Among these, a pellicle frame having a thickness equal to or thinner than 4 mm is used for protecting an exposure stencil such as the photomask, the reticle having a small pattern breadth or the like. In the case where two or more superposition exposure operations are required, it is sometimes required to keep the distortion of the exposure stencil particularly small. On the other hand, as the thickness of a pellicle frame becomes thinner, the distortion of the exposure stencil becomes smaller when the pellicle frame is mounted on the exposure stencil. Therefore, the present invention is particularly advantageous when a pellicle frame having a thickness equal to or thinner than 4 mm is to be adhered onto the exposure stencil such as the photomask, the reticle or the like.

The above and other objects and features of the present invention will become apparent from the following description made with reference to the accompanying drawings.

DESCRIPTION OF THE PREFERRED EMBODIMENTS

Figure 1:
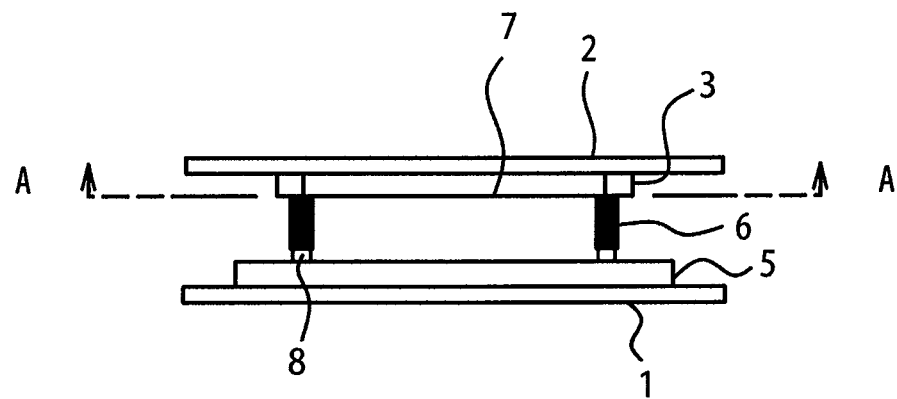
FIG. 1 is a schematic side view showing an adhering apparatus for a lithographic pellicle that is a preferred embodiment of the present invention.
Figure 2:
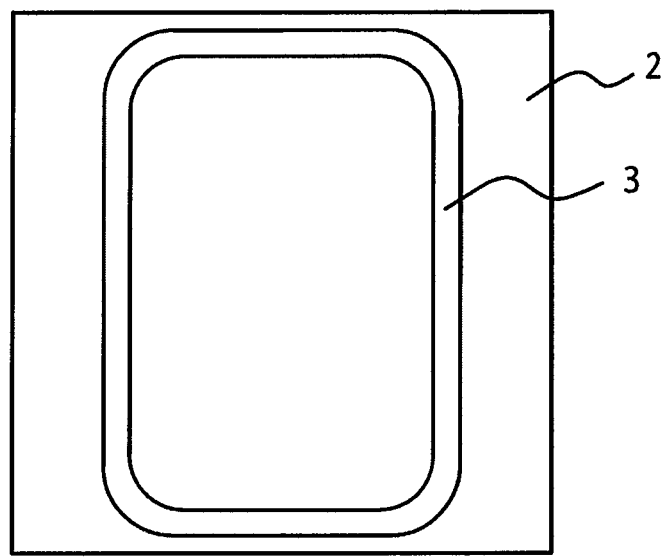
FIG. 2 is a schematic lateral cross sectional view of the adhering apparatus for a lithographic pellicle that is a preferred embodiment of the present invention taken along a line A-A in FIG. 1.

FIG. 1 is a schematic side view showing an adhering apparatus for a pellicle for lithography that is a preferred embodiment of the present invention and FIG. 2 is a schematic lateral cross sectional view of the adhering apparatus for a pellicle for lithography taken along a line A-A in FIG. 1.

As shown in FIGS. 1 and 2, an adhering apparatus for a pellicle for lithography according to this preferred embodiment of the present invention includes a substrate 1 on which an exposure stencil 5 such as a photomask, a reticle or the like is to be placed and a planar pressure plate 2 for pressing a frame-like shaped pellicle frame 6.

A frame-like shaped compressively deformable member including a bag 3 containing a low viscosity liquid therein is mounted on the lower surface of the pressure plate 2 so as to be along the sides of the pellicle frame 6 and face the pellicle frame 6. Here, in this embodiment, the pellicle frame 6 has a thickness of 4 mm.

In FIG. 1, the reference numeral 7 designates a pellicle membrane adhered on the pellicle frame 6 and the reference numeral 8 designates an agglutinant layer formed of an adhesive agent for adhering the pellicle frame 6 onto the exposure stencil 5.

In the thus constituted adhering apparatus for a pellicle, one surface of the pellicle frame 6 is adhered onto the exposure stencil 5 such as a photomask, a reticle or the like while the pellicle membrane 7 is adhered to the other surface of the pellicle frame 6.

When the pellicle frame 6 is to be adhered onto the exposure stencil 5 such as the photomask, the reticle or the like, the exposure stencil 5 is first set on the upper surface of the substrate 1.

Next, the agglutinant agent layer 8 is formed on regions of the surface of the exposure stencil 5 where the pellicle frame 6 is to be adhered and the pellicle frame 6 is then adhered onto the agglutinant agent layer 8.

Further, a pellicle adhering apparatus including the pressure plate 2 and the frame-like shaped compressively deformable member mounted on the lower surface of the pressure plate 2 and essentially consisting of the bag 3 containing a low viscosity liquid is set on the pellicle frame 6 and a predetermined pressure is then applied onto the pressure plate 2.

As a result, the pressure plate 2 presses the pellicle frame 6 via the bag 3 toward the exposure stencil 5.

At this time, in the case where the flatness of the pellicle frame 6 is low and the surface of the pellicle frame 6 facing the pressure plate 2 is formed with convex surface regions and concave surface regions, if the pressure plate 2 should directly press the pellicle frame 6, the pressure applied from the pressure plate 2 onto the convex surface regions of the pellicle frame 6 would be high while the pressure applied from the pressure plate 2 onto the concave surface regions of the pellicle frame 6 would be low. As a result, the pressure applied from the pellicle frame 6 onto the exposure stencil 5 would be non-uniform, whereby there would be some risk of the exposure stencil 5 being distorted.

However, in this preferred embodiment, since the pellicle frame 6 is pressed by the pressure plate 2 via the frame-like shaped compressively deformable member including the bag 3 in which a low viscosity liquid is contained and the bag 3 contains a low viscosity liquid, the bag 3 containing the low viscosity liquid is deformed in accordance with the magnitude of the pressure applied onto the bag 3, whereby a uniform pressure is applied from the pellicle frame 6 onto the exposure stencil 5 such as the photomask, the reticle or the like.

More specifically, in the portion of the bag 3 facing the convex surface regions of the pellicle frame 6 onto which a high pressure is applied, the low viscosity liquid contained in the bag 3 is pushed away, whereby the bag 3 is greatly deformed, while in the portion of the bag 3 facing the concave surface regions of the pellicle frame 6 onto which a low pressure is applied, the low viscosity liquid contained in regions of the bag 3 facing the regions of the pellicle frame 6 onto which a higher pressure is applied than the pressure applied to the portion of the bag 3 facing the concave surface regions of the pellicle frame 6 flows into this portion of the bag 3, whereby the deformation of the bag 3 is small. As a result, even if the flatness of the pellicle frame 6 is low, it is possible to uniformize the distribution of the pressure applied onto exposure stencil 5 from the pellicle frame 6.

Therefore, when the pellicle frame 6 is adhered onto the exposure stencil 5 such as the photomask, the reticle or the like, it is possible to effectively prevent the exposure stencil 5 from being distorted due to unevenness of the distribution of the pressure applied onto the exposure stencil 5 from the pellicle frame 6.

In the adhering apparatus for a lithographic pellicle shown in FIGS. 1 and 2, the bag 3 containing a low viscosity liquid is used as the compressively deformable member having a frame-like shape. However, a frame-like shaped compressively deformable member may be formed of a resin having a low elasticity instead of the bag 3 containing a low viscosity liquid.

Figure 3:
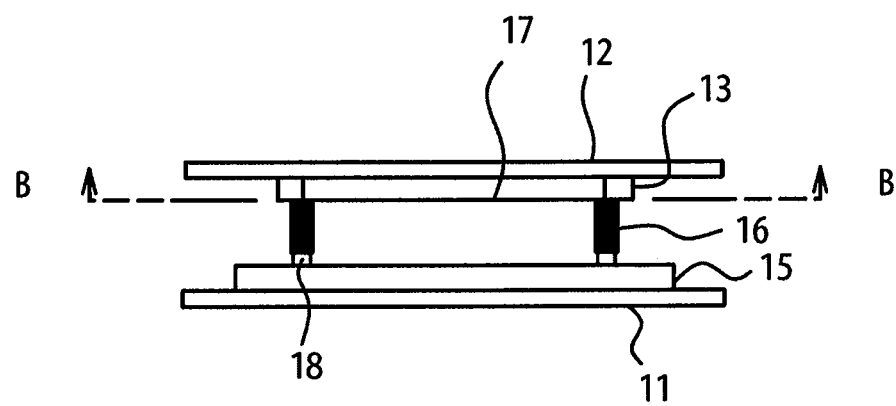
FIG. 3 is a schematic side view showing an adhering apparatus for a lithographic pellicle that is another preferred embodiment of the present invention.
Figure 4:
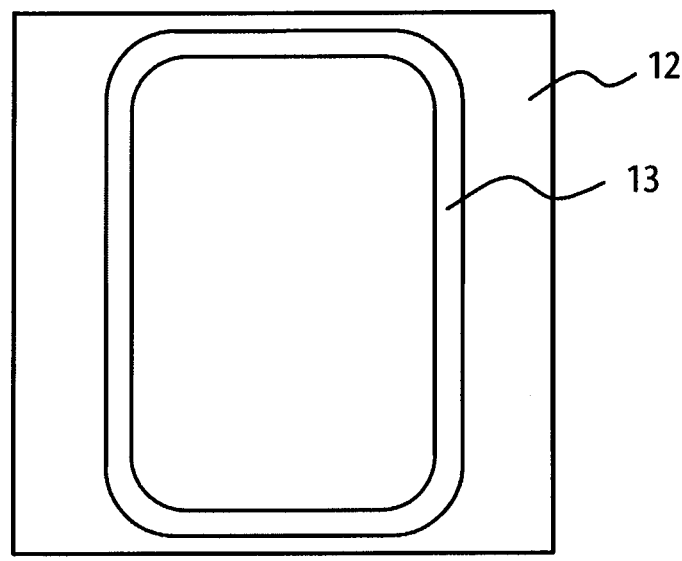
FIG. 4 is a schematic lateral cross sectional view of the adhering apparatus for a lithographic pellicle that is another preferred embodiment of the present invention taken along a line B-B in FIG. 3.

FIG. 3 is a schematic side view showing an adhering apparatus for a pellicle for lithography that is another preferred embodiment of the present invention and FIG. 4 is a schematic lateral cross sectional view of the adhering apparatus for a pellicle for lithography taken along a line B-B in FIG. 3.

As shown in FIGS. 3 and 4, an adhering apparatus for a pellicle for lithography according to this preferred embodiment of the present invention includes a frame-like shaped compressively deformable member 13 formed of a resin having a low elasticity instead of the bag 3 containing a low viscosity liquid.

Similarly to the preferred embodiment shown in FIGS. 1 and 2, in this preferred embodiment, the frame-like shaped compressively deformable member 13 formed of a resin having a low elasticity is mounted on the lower surface of a planar pressure plate 12 so as to be aligned to meet the sides of the frame-like shaped pellicle frame 16 and face the pellicle frame 16.

In this preferred embodiment, an exposure stencil 15 such as the photomask, the reticle or the like is to be placed on a substrate 11 and an agglutinant agent layer 18 is formed on the surface of the exposure stencil 15 to be adhered with the pellicle frame 16.

In FIGS. 3 and 4, the reference numeral 17 designates pellicle membrane fixed to the pellicle frame 16 and the pellicle membrane 17 is fixed on the side of the pellicle frame 16 on the opposite side from the agglutinant agent layer 18.

In the thus constituted adhering apparatus for a pellicle, one surface of the pellicle frame 16 is adhered onto the exposure stencil 15 such as a photomask, a reticle or the like while the pellicle membrane 17 is adhered onto the other surface of the pellicle frame 16.

When the pellicle frame 16 is to be adhered onto the exposure stencil 15 such as the photomask, the reticle or the like, the exposure stencil 15 is first set on the upper surface of the substrate 11.

Next, the agglutinant agent layer 18 is formed on regions of the surface of the exposure stencil 15 where the pellicle frame 16 is to be adhered and the pellicle frame 16 is then adhered onto the agglutinant layer 18.

Further, a pellicle adhering apparatus including the pressure plate 12 and the frame-like shaped compressively deformable member 13 constituted by a resin that has a low elasticity and is mounted on the lower surface of the pressure plate 12 is set on the pellicle frame 16 and a predetermined pressure is then applied onto the pressure plate 12.

As a result, the pressure plate 12 presses the pellicle frame 16 toward the exposure stencil 15 via the frame-like shaped compressively deformable member 13 constituted of a resin having a low elasticity At this time, in the case where the flatness of the pellicle frame 16 is low and the surface of the pellicle frame 16 facing the pressure plate 12 is formed with convex surface regions and concave surface regions, if the pressure plate 12 should directly press the pellicle frame 16, the pressure applied from the pressure plate 12 onto the convex surface regions of the pellicle frame 16 would be high, while the pressure applied from the pressure plate 12 onto the concave surface regions of the pellicle frame 16 would be low. As a result, the pressure applied from the pellicle frame 16 onto the exposure stencil 15 would be non-uniform, whereby there would be some risk of the exposure stencil 15 being distorted.

However, in this preferred embodiment, since the pellicle frame 16 is pressed by the pressure plate 12 via the frame-like shaped compressively deformable member 13 constituted by a resin having a low elasticity, the frame-like shaped compressively deformable member 13 is deformed in accordance with the magnitude of the pressure applied thereonto, whereby a uniform pressure is applied from the pellicle frame 16 onto the exposure stencil 15 such as the photomask, the reticle or the like.

More specifically, in the portion of the frame-like shaped compressively deformable member 13 constituted by a resin having a low elasticity and facing the convex surface regions of the pellicle frame 16 onto which a high pressure is applied, the resin having a low elasticity forming the frame-like shaped compressively deformable member 13 is greatly deformed, while in the portion of the frame-like shaped compressively deformable member 13 facing the concave surface regions of the pellicle frame 16 onto which a low pressure is applied, the deformation of the frame-like shaped compressively deformable member 13 constituted of a resin having a low elasticity is small. As a result, even in the case where the flatness of the pellicle frame 16 is low, the pressure applied from the pellicle frame 16 to the exposure stencil 15 is uniformized.

Therefore, when the pellicle frame 16 is adhered to the exposure stencil 15 such as a photomask, a reticle or the like, it is possible to effectively prevent the exposure stencil 15 from being distorted due to unevenness of the distribution of the pressure applied from the pellicle frame 16 onto the exposure stencil 15 such as the photomask, the reticle or the like.

Figure 5:
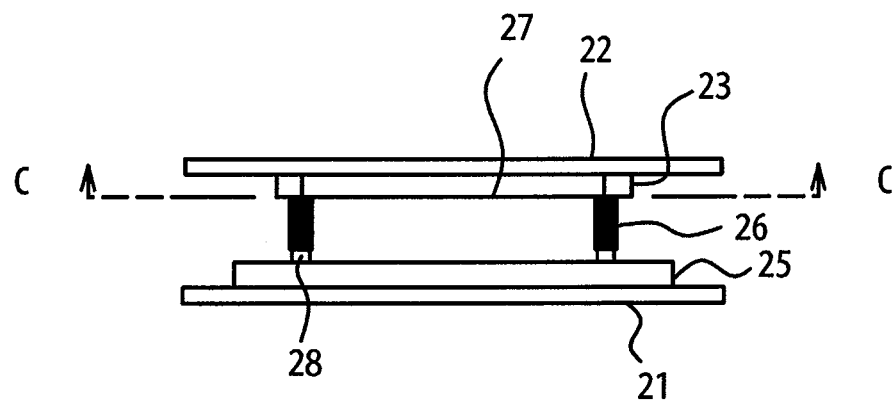
FIG. 5 is a schematic side view showing an adhering apparatus for a lithographic pellicle that is a further preferred embodiment of the present invention.
Figure 6:
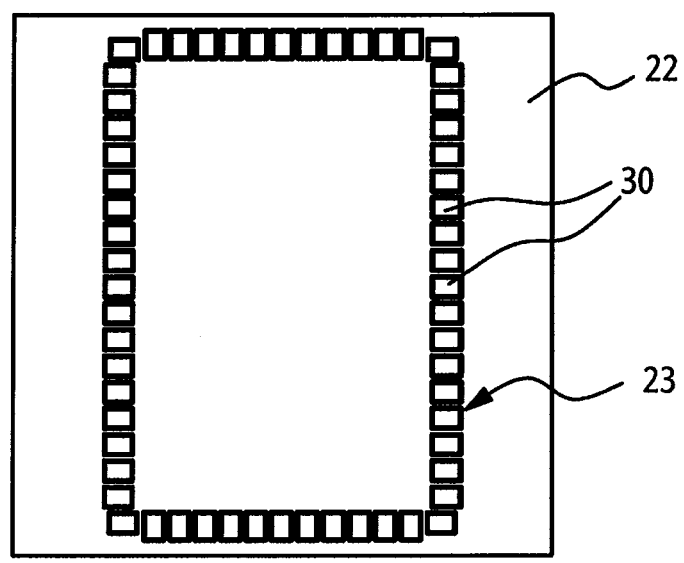
FIG. 6 is a schematic lateral cross sectional view of the adhering apparatus for a lithographic pellicle that is a further preferred embodiment of the present invention taken along a line C-C in FIG. 5.

FIG. 5 is a schematic side view showing an adhering apparatus for a pellicle for lithography that is a further preferred embodiment of the present invention and FIG. 6 is a schematic lateral cross sectional view of the adhering apparatus for a pellicle for lithography taken along a line C-C in FIG. 5.

As shown in FIGS. 5 and 6, in an adhering apparatus for a pellicle for lithography according to this preferred embodiment of the present invention, a plurality of spring members 30 having the same elasticity are used as a frame-like shaped compressively deformable member 23.

The plurality of spring members 30 are mounted on the lower surface of a planar pressure plate 22 at substantially equal spacing so as to face a pellicle frame 26 along the sides of the pellicle frame 26. The center-to-center distance between neighboring spring members 23 is set to be equal to or less than 5 mm and it is set 4 mm in this preferred embodiment, for example.

Thus, in this preferred embodiment, the frame-like shaped compressively deformable member 23 is constituted as a plurality of spring members 30.

In this embodiment, the pellicle frame 26 has a thickness of 4 mm.

In FIGS. 5 and 6, the reference numeral 21 designates a substrate on which an exposure stencil 25 is to be placed, the reference numeral 27 designates a pellicle membrane adhered to the pellicle frame 26 and the reference numeral 28 designates an agglutinant layer formed of an adhesive agent for adhering the pellicle frame 26 to the exposure stencil 25 such as the photomask, the reticle or the like.

In the thus constituted adhering apparatus for a pellicle for lithography, one surface of the pellicle frame 26 is adhered onto the exposure stencil 25 such as a photomask, a reticle or the like, while the pellicle membrane 27 is adhered onto the other surface of the pellicle frame 26.

When the pellicle frame 26 is to be adhered onto the exposure stencil 25, the exposure stencil 25 is first set on the upper surface of the substrate 21.

Next, the agglutinant layer 28 is formed on regions of the surface of the exposure stencil 25 where the pellicle frame 26 is to be adhered and the pellicle frame 26 is then adhered onto the agglutinant agent layer 28.

Further, a pellicle adhering apparatus including the pressure plate 22 and the frame-like shaped compressively deformable member 23 constituted of the plurality of spring members 30 that have the same elasticity and are mounted on the lower surface of the pressure plate 22 is set on the pellicle frame 26 and a predetermined pressure is then applied onto the pressure plate 22.

As a result, the pressure plate 22 presses the pellicle frame 26 toward the exposure stencil 25 via the plurality of spring members 23.

At this time, in the case where the flatness of the pellicle frame 26 is low and the surface of the pellicle frame 26 facing the pressure plate 22 is formed with convex surface regions and concave surface regions, if the pressure plate 22 should directly press the pellicle frame 26, the pressure applied from the pressure plate 22 onto the convex surface regions of the pellicle frame 26 would be high, while the pressure applied from the pressure plate 22 onto the concave surface regions of the pellicle frame 26 would be low. As a result, the pressure applied from the pellicle frame 26 onto the exposure stencil 25 would be non-uniform, whereby there would be some risk of the exposure stencil 25 being distorted.

However, in this preferred embodiment, since the pellicle frame 26 is constituted so as to be pressed by the pressure plate 23 via the frame-like shaped compressively deformable member constituted of the plurality of spring members 30 having the same elasticity, the spring members 30 are compressed in accordance with the magnitude of a pressure applied onto them so that the amount of compression of each is proportional to the pressure applied thereonto, whereby a uniform pressure is applied from the pellicle frame 26 onto the exposure stencil 25 such as the photomask, the reticle or the like.

More specifically, the regions of the frame-like shaped compressively deformable member 23 constituted by the plurality of spring members 30 facing the convex surface regions of the pellicle frame 26 onto which a high pressure is applied are greatly compressed. On the other hand, the regions of the frame-like shaped compressively deformable member 23 constituted of the plurality of spring members 30 facing the concave surface regions of the pellicle frame 26 onto which a low pressure is applied are deformed and compressed but the amount of the compression of each of the spring members 30 is small. Therefore, even in the case where the flatness of the pellicle frame 26 is low, it is possible to uniformize the distribution of the pressure applied from the pellicle frame 26 onto exposure stencil 25 such as the photomask, the reticle or the like.

Thus, according to this preferred embodiment, when the pellicle frame 26 is to be adhered onto the exposure stencil 25, it is possible to effectively prevent the exposure stencil 25 from being distorted due to unevenness of the pressure applied onto the exposure stencil 25 from the pellicle frame 26.

WORKING EXAMPLES AND COMPARATIVE EXAMPLES

Hereinafter, working examples and comparative examples will be set out in order to further clarify the technical advantages of the present invention.

Working Example 1

An adhering apparatus for a pellicle similar to the adhering apparatus for a pellicle shown in FIGS. 1 and 2 was used wherein a bag containing deionized water and made of polyethylene was mounted as a frame-like shaped compressively deformable member on the lower surface of a pressure plate so as to be aligned to meet the sides of the pellicle frame and face the pellicle frame. Using the thus constituted adhering apparatus for a pellicle, the pellicle frame, whose size was 149 mm×115 mm×4.0 mm and flatness was 13 μm, was mounted on a reticle having flatness of 25 μm.

Here, the flatness of the pellicle frame is defined as the distance between the uppermost part of the pellicle frame and the lowermost part of the pellicle frame with respect to an averaged hypothetical surface of the pellicle frame placed horizontally. On the other hand, the flatness of the reticle was defined as the distance between the uppermost part of the reticle and the lowermost part of the reticle with respect to an averaged hypothetical surface of the reticle placed horizontally.

When the pellicle frame was to be adhered onto the reticle, a pressure of 5 kg was applied for thirty (30) seconds using a load of 5 kg onto a frame-like shaped compressively deformable member constituted by the bag made of polyethylene and containing a deionized water and the velocity of the pressure plate while the frame-like shaped compressively deformable member was in contact with the pellicle frame was determined to be 0.5 mm/sec so as to apply a pressure onto the pressure plate, whereby the pellicle frame was pressed toward the reticle by the pressure plate via the frame-like shaped compressively deformable member constituted by the bag made of polyethylene and containing deionized water.

After the pellicle frame had been adhered to the reticle in this manner, the flatness of the reticle was measured and it was found that the flatness of the reticle was 27 μm and the change in the flatness of the reticle before and after the pellicle frame was adhered was only 2 μm, which was within the tolerance level of 5 μm and considerably low.

Working Example 2

A pellicle frame having a size of 149 mm×115 mm×4.0 mm and a flatness of 12 μm was adhered to a reticle having a flatness of 24 μm similarly to in Working Example 1 except that an adhering apparatus for a pellicle for lithography including a frame-like shaped compressively deformable member made of silicone gum (Product Name "GUM DV-3") manufactured by Shin-Etsu Chemical Co., Ltd. was employed instead of the adhering apparatus provided with the bag made of polyethylene and containing a deionized water used in Working Example 1.

When the pellicle frame was to be adhered onto the reticle, similarly to in Working Example 1, a pressure of 5 kg was applied for thirty (30) seconds using a load of 5 kg onto the frame-like shaped compressively deformable member constituted by silicone gum (Product Name "GUM DV-3") manufactured by Shin-Etsu Chemical Co., Ltd. and the velocity of the pressure plate while the frame-like shaped compressively deformable member was in contact with the pellicle frame was determined to be 0.5 mm/sec so as to apply a pressure onto the pressure plate, whereby the pellicle frame was pressed toward the reticle by the pressure plate via the frame-like shaped compressively deformable member constituted of silicone gum (Product Name "GUM DV-3") manufactured by Shin-Etsu Chemical Co., Ltd.

After the pellicle frame had been adhered to the reticle in this manner, the flatness of the reticle was measured and it was found that the flatness of the reticle was 28 μm and the change in the flatness of the reticle before and after the pellicle frame was adhered was only 4 μm, which was within the tolerance level of 5 μm and sufficiently low.

Working Example 3

Using an adhering apparatus for a pellicle similar to the adhering apparatus for a pellicle shown in FIGS. 5 and 6, a pellicle frame having a size of 149 mm×115 mm×4.0 mm and a flatness of 11 μm was adhered onto a reticle having a flatness of 25 μm wherein a frame-like shaped compressively deformable member constituted of one hundred seventy (170) spring members having substantially the same spring coefficient were mounted onto the lower surface of the pressure plate so as to be along the sides of the pellicle frame and face the pellicle frame in such a manner that they were spaced from each other at substantially equal intervals. In this Working Example 3, the center-to-center distance between neighboring spring members was determined to be about 3.11 mm.

When the pellicle frame was to be adhered onto the reticle, similarly to in Working Example 1, a pressure of 5 kg was applied for thirty (30) seconds using a load of 5 kg onto the frame-like shaped compressively deformable member constituted of one hundred seventy (170) spring members and the velocity of the pressure plate while the frame-like shaped compressively deformable member was in contact with the pellicle frame was determined to be 0.5 mm/sec so as to apply a pressure onto the pressure plate, whereby the pellicle frame was pressed toward the reticle by the pressure plate via the frame-like shaped compressively deformable member constituted of one hundred seventy (170) spring members mounted on the lower surface of the pressure plate at substantially equal spacing.

After the pellicle frame had been adhered to the reticle in this manner, the flatness of the reticle was measured and it was found that the flatness of the reticle was 28 μm and the change in the flatness of the reticle before and after the pellicle frame was adhered was only 3 μm, which was within the tolerance level of 5 μm and sufficiently low.

Comparative Example 1

A pellicle frame having a size of 149 mm×115 mm×4.0 mm and a flatness of 13 μm was adhered to a reticle having a flatness of 24 μm using the adhering apparatus used in Working Example 2 except that instead of the frame-like shaped compressively deformable member made of a silicone gum (Product Name "GUM DV-3") manufactured by Shin-Etsu Chemical Co., Ltd., a frame-like shaped compressively deformable member made of a polyether ether ketone resin was used and the surface of the frame-like shaped compressively deformable member to be brought into contact with a pellicle frame was polished so that the flatness thereof was about 30 μm.

When the pellicle frame was to be adhered onto the reticle, similarly to in Working Example 2, a pressure of 5 kg was applied for thirty (30) seconds using a load of 5 kg onto the frame-like shaped compressively deformable member made of polyether ether ketone resin and the velocity of the pressure plate while the frame-like shaped compressively deformable member was in contact with the pellicle frame was determined to be 0.5 mm/sec so as to apply a pressure onto the pressure plate, whereby the pellicle frame was pressed toward the reticle by the pressure plate via the frame-like shaped compressively deformable member made of the polyether ether ketone resin.

After the pellicle frame had been adhered to the reticle in this manner, the flatness of the reticle was measured and it was found that the flatness of the reticle was 36 μm and the change in the flatness of the reticle before and after the pellicle frame was adhered thereto was 12 μm and exceeded the tolerance level of 5 μm.

Comparative Example 2

Instead of the pellicle adhering apparatus including the frame-like shaped compressively deformable member made of a polyether ether ketone resin, a pellicle adhering apparatus including a frame-like shaped compressively deformable member made of aluminum was used similarly to in Comparative Example 1 to adhere a pellicle frame having a size of 149 mm×115 mm×4.0 mm and a flatness of 14 μm to a reticle having a flatness of 23 μm, similarly to in Comparative Example 1 except that the surface of the compressively deformable member having a frame-like shape to be brought into contact with the pellicle frame was polished so that the flatness thereof became about 10 μm.

When the pellicle frame was to be adhered onto the reticle, similarly to in Comparative Example 1, a pressure of 5 kg was applied for thirty (30) seconds using a load of 5 kg onto the frame-like shaped compressively deformable member made of aluminum and the velocity of the pressure plate when the frame-like shaped compressively deformable member was in contact with the pellicle frame was determined to be 0.5 mm/sec so as to apply a pressure onto the pressure plate, whereby the pellicle frame was pressed toward the reticle via the frame-like shaped compressively deformable member constituted of aluminum.

After the pellicle frame had been adhered to the reticle in this manner, the flatness of the reticle was measured and it was found that the flatness of the reticle was 39 μm and the change in the flatness of the reticle before and after the pellicle frame was adhered thereto was 12 μm and exceeded the tolerance level of 5 μm.

Comparative Example 3

A pellicle frame having a size of 149 mm×115 mm×4.0 mm and a flatness of 11 μm was adhered to a reticle having a flatness of 25 μm using an adhering apparatus similar to the adhering apparatus for a pellicle shown in FIGS. 5 and 6 in which a frame-like shaped compressively deformable member constituted of one hundred (100) spring members having substantially the same spring coefficient was mounted onto the lower surface of a pressure plate so as to be along the sides of the pellicle frame and face the pellicle frame in such a manner that they were spaced from each other at substantially equal intervals. The center-to-center distance between neighboring spring members was about 5.28 mm.

When the pellicle frame was to be adhered onto the reticle, similarly to in Working Example 1, a pressure of 5 kg was applied for thirty (30) seconds using a load of 5 kg onto the frame-like shaped compressively deformable member constituted of one hundred (100) spring members and the velocity of the pressure plate while the frame-like shaped compressively deformable member was in contact with the pellicle frame was determined to be 0.5 mm/sec so as to apply a pressure onto the pressure plate, whereby the pellicle frame was pressed toward the reticle by the pressure plate via the one hundred (100) spring members mounted on the lower surface of the pressure plate at substantially equal intervals.

After the pellicle frame had been adhered to the reticle in this manner, the flatness of the reticle was measured and it was found that the flatness of the reticle was 32 μm and the change in the flatness of the reticle before and after the pellicle frame was adhered was 7 μm and exceeded the tolerance level of 5 μm.

Comparative Example 4

A pellicle frame having a size of 149 mm×115 mm×4.0 mm and a flatness of 11 μm was adhered to a reticle having a flatness of 23 μm using an adhering apparatus similar to the adhering apparatus for a pellicle shown in FIGS. 5 and 6 in which a frame-like shaped compressively deformable member constituted of one hundred seventy (170) spring members having substantially the same spring coefficient was mounted onto the lower surface of the pressure plate so as to be along the sides of the pellicle frame and face the pellicle frame in such a manner that they were spaced from each other at substantially equal intervals. The center-to-center distance between neighboring spring members was about 3.11 mm.

When the pellicle frame was to be adhered onto the reticle, similarly to in Working Example 1, a pressure of 15 kg was applied for thirty (30) seconds using a load of 15 kg onto the frame-like shaped compressively deformable member constituted of one hundred seventy (170) spring members and the velocity of a pressure plate when the frame-like shaped compressively deformable member was in contact with the pellicle frame was determined to be 0.5 mm/sec so as to apply a pressure onto the pressure plate, whereby the pellicle frame was pressed toward the reticle via the one hundred seventy (170) spring members mounted on the lower surface of the pressure plate at substantially equal intervals.

After the pellicle frame had been adhered to the reticle in this manner, the flatness of the reticle was measured and it was found that the flatness of the reticle was 30 μm and the change in the flatness of the reticle before and after the pellicle frame was adhered was 7 μm and exceeded the tolerance level of 5 μm.

Comparative Example 5

Similarly to in Working Example 2, a pellicle frame having a size of 149 mm×115 mm×4.0 mm and a flatness of 12 μm was adhered to a reticle having a flatness of 22 μm using an adhering apparatus for a pellicle provided with a frame-like shaped compressively deformable member made of silicone gum (Product Name "GUM DV-3") manufactured by Shin-Etsu Chemical Co., Ltd.

When the pellicle frame was to be adhered onto the reticle, similarly to in Working Example 2, a pressure of 15 kg was applied for thirty (30) seconds using a load of 15 kg onto a frame-like shaped compressively deformable member made of a silicone gum (Product Name "GUM DV-3") manufactured by Shin-Etsu Chemical Co., Ltd. and the velocity of the pressure plate while the frame-like shaped compressively deformable member was in contact with the pellicle frame was determined to be 0.5 mm/sec so as to apply a pressure onto the pressure plate, whereby the pellicle frame was pressed toward the reticle via the frame-like shaped compressively deformable member constituted of the silicone gum (Product Name "GUM DV-3") manufactured by Shin-Etsu Chemical Co., Ltd.

After the pellicle frame had been adhered to the reticle in this manner, the flatness of the reticle was measured and it was found that the flatness of the reticle was 30 μm and the change in the flatness of the reticle before and after the pellicle frame had been adhered was 8 μm and exceeded the tolerance level of 5 μm.

Comparative Example 6

Similarly to in Comparative Example 5, a pellicle frame having a size of 149 mm×115 mm×4.0 mm and a flatness of 12 μm was adhered to a reticle having a flatness of 22 μm using an adhering apparatus for a pellicle provided with a frame-like shaped compressively deformable member made of silicone gum (Product Name "GUM DV-3") manufactured by Shin-Etsu Chemical Co., Ltd.

When the pellicle frame was to be adhered onto the reticle, similarly to in Working Example 2, a pressure of 5 kg was applied for thirty (30) seconds using a load of 5 kg onto the frame-like shaped compressively deformable member constituted of silicone gum (Product Name "GUM DV-3") manufactured by Shin-Etsu Chemical Co., Ltd. and the velocity of the pressure plate when the frame-like shaped compressively deformable member was in contact with the pellicle frame was determined to be 1.2 mm/sec so as to apply a pressure onto the pressure plate, whereby the pellicle frame was pressed toward the reticle via the frame-like shaped compressively deformable member constituted of the silicone gum (Product Name "GUM DV-3") manufactured by Shin-Etsu Chemical Co., Ltd.

After the pellicle frame had been adhered to the reticle in this manner, the flatness of the reticle was measured and it was found that the flatness of the reticle was 29 μm and the change in the flatness of the reticle before and after the pellicle frame was adhered was 7 μm and exceeded the tolerance level of 5 μm.

The present invention has thus been shown and described with reference to specific embodiments and Working Examples. However, it should be noted that the present invention is in no way limited to the details of the described arrangements but changes and modifications may be made without departing from the scope of the appended claims.

For example, in the above described preferred embodiment shown in FIGS. 1 and 2, although the bag 3 made of polyethylene and containing a low viscosity liquid was used as the frame-like shaped compressively deformable member, it is not absolutely necessary for the bag 3 to be made of polyethylene.

Further, in the above described preferred embodiment shown in FIGS. 1 and 2, the above described preferred embodiment shown in FIGS. 3 and 4 and the above described preferred embodiment shown in FIGS. 5 and 6, although the pellicle frame 6, 16, 26 has a thickness of 4 mm, it is not absolutely necessary for the pellicle frame 6, 16 to have a thickness of 4 mm.

Furthermore, in the above described preferred embodiment shown in FIGS. 5 and 6, the apparatus for adhering a pellicle frame 26 includes the plurality of spring members 30 as the frame-like shaped compressively deformable member 23 and the plurality of spring members 30 are mounted on the lower surface of the pressure plate 22 at equally-spaced intervals so as to be along the sides of the pellicle frame 26 and face the frame-like shaped pellicle frame 26 and so that the center-to-center distance between the neighboring spring members 30 is set to be equal to or less than 5 mm, for example, 4 mm. However, the center-to-center distance between neighboring spring members 30, namely, the center-to-center distance between neighboring unit compressively deformable member, can be arbitrary determined in accordance with the size of the pellicle frame 26 and the like. Thus, it is not absolutely necessary to set the center-to-center distance between neighboring spring members 30 to be 4 mm and set the center-to-center distance between neighboring spring members 30 to be equal to or less than 5 mm.

As described above, according to the present invention, it is possible to provide a method of adhering a pellicle for lithography which can uniformize the distribution of the pressure applied onto an exposure stencil such as a photomask, a reticle or the like via a pellicle frame when a pellicle is adhered onto the exposure stencil and effectively prevent the exposure stencil from being deformed when the pellicle is adhered onto the exposure stencil.

Further, according to the present invention, it is possible to provide an adhering apparatus for a pellicle for lithography which can uniformize the distribution of the pressure applied onto an exposure stencil such as a photomask, a reticle or the like via a pellicle frame when a pellicle is adhered onto the exposure stencil and effectively prevent the exposure stencil from being deformed when the pellicle is adhered onto the exposure stencil.

The invention claimed is:

1. A method of adhering a pellicle for lithography comprising a step of adhering a frame-like shaped pellicle frame onto an exposure stencil, the method further comprising a step of pressing the pellicle frame toward the exposure stencil by a pressure plate via a compressively deformable member mounted on the surface of the pressure plate in such a manner that it can meet the sides of the pellicle frame, the frame-like shaped compressively deformable member being easily deformable when a pressure is applied thereto.

2. A method of adhering a pellicle for lithography in accordance with claim 1, wherein the frame-like shaped compressively deformable member is constituted so that the amount of deformation thereof depends upon a pressure applied thereto.

3. A method of adhering a pellicle for lithography in accordance with claim 2, wherein the frame-like shaped compressively deformable member is constituted so that the amount of deformation thereof is substantially proportional to a pressure applied thereon.

4. A method of adhering a pellicle for lithography in accordance with claim 2, wherein the frame-like shaped compressively deformable member is constituted by a bag containing a low viscosity liquid.

5. A method of adhering a pellicle for lithography in accordance with claim 2, wherein the frame-like shaped compressively deformable member is formed of a resin having a low elasticity.

6. A method of adhering a pellicle for lithography in accordance with claim 2, wherein the frame-like shaped compressively deformable member is constituted by a plurality of unit compressively deformable members aligned to meet the sides of the pellicle frame.

7. A method of adhering a pellicle for lithography in accordance with claim 6, wherein the center-to-center distance of neighboring unit compressively deformable members measured along the pellicle frame is equal to or shorter than 5 (five) mm.

8. A method of adhering a pellicle for lithography in accordance with claim 7, wherein the unit compressively deformable member is constituted of a spring member and the frame-like shaped compressively deformable member is constituted as the plurality of spring members aligned to meet the sides of the pellicle frame and having the same spring coefficient.

9. A method of adhering a pellicle for lithography in accordance with claim 6, wherein the unit compressively deformable member is constituted of a spring member and the frame-like shaped compressively deformable member is constituted as the plurality of spring members aligned to meet the sides of the pellicle frame and having the same spring coefficient.

10. A method of adhering a pellicle for lithography in accordance with claim 2, wherein a load pressing the pressure plate is equal to or smaller than 10 kg.

11. A method of adhering a pellicle for lithography in accordance with claim 2, wherein a flatness of the pellicle frame is equal to or lower than 30 µm.

12. A method of adhering a pellicle for lithography in accordance with claim 2, wherein a thickness of the pellicle frame is equal to or thinner than 4 mm.

13. An adhering apparatus for a pellicle for lithography comprising a pressure plate for pressing a frame-like shaped pellicle frame of a pellicle toward an exposure stencil, wherein a frame-like shaped compressively deformable member easily deformable when being pressed is mounted on the surface of the pressure plate facing the pellicle frame aligned to meet the sides of the pellicle frame.

14. An adhering apparatus for a pellicle for lithography in accordance with claim 13, wherein the frame-like shaped compressively deformable member is constituted so that the amount of deformation thereof depends upon a pressure applied thereto.

15. An adhering apparatus for a pellicle for lithography in accordance with claim 14, wherein the frame-like shaped compressively deformable member is constituted so that the amount of deformation thereof is substantially proportional to a pressure applied thereon.

16. An adhering apparatus for a pellicle for lithography in accordance claim 14, wherein the frame-like shaped compressively deformable member is constituted of a bag containing a low viscosity liquid.

17. An adhering apparatus for a pellicle for lithography in accordance with claim 14, wherein the frame-like shaped compressively deformable member is formed of a resin having a low elasticity.

18. An adhering apparatus for a pellicle for lithography in accordance with claim 14, wherein the frame-like shaped compressively deformable member is constituted of a plurality of unit compressively deformable member aligned to meet the sides of the pellicle frame.

19. An adhering apparatus for a pellicle for lithography in accordance with claim 18, wherein a center-to-center distance of neighboring unit compressively deformable member measured along the pellicle frame is equal to or shorter than 5 (five) mm.

20. An adhering apparatus for a pellicle for lithography in accordance with claim 18, wherein the unit compressively deformable member is constituted of a spring member and the frame-like shaped compressively deformable member is constituted of a plurality of spring members aligned to meet the sides of the pellicle frame and having the same spring coefficient.

* * * * *